(12) United States Patent
Yoshida et al.

(10) Patent No.: US 8,022,521 B1
(45) Date of Patent: Sep. 20, 2011

(54) PACKAGE FAILURE PROGNOSTIC STRUCTURE AND METHOD

(75) Inventors: Akito Yoshida, Chandler, AZ (US); Mahmoud Dreiza, Phoenix, AZ (US)

(73) Assignee: Amkor Technology, Inc., Chandler, AZ (US)

(*) Notice: Subject to any disclaimer, the term of this patent is extended or adjusted under 35 U.S.C. 154(b) by 284 days.

(21) Appl. No.: 12/269,357

(22) Filed: Nov. 12, 2008

(51) Int. Cl.
*H01L 23/02* (2006.01)
(52) U.S. Cl. . 257/678; 257/690; 257/734; 257/E23.024; 257/E23.031
(58) Field of Classification Search .............. 257/678, 257/690, 696, 734, 730, E23.024, E23.031, 257/E23.032, E23.036, E23.045, E23.06, 257/E23.061, E23.07
See application file for complete search history.

(56) References Cited

U.S. PATENT DOCUMENTS 5,334,857 A * 8/1994 Mennitt et al. ................. 257/48
7,071,487 B2 * 7/2006 Maruyama ..................... 257/48

FOREIGN PATENT DOCUMENTS

JP 2007-329159 12/2007

OTHER PUBLICATIONS

St. Amand et al., "Die-mounting Substrate and Method Incorporating Dummy Traces for Improving Mounting Film Planarity", U.S. Appl. No. 11/111,316, filed Apr. 21, 2005.

* cited by examiner

*Primary Examiner* — Zandra Smith
*Assistant Examiner* — Paul E Patton
(74) *Attorney, Agent, or Firm* — Gunnison, McKay & Hodgson, L.L.P.; Serge J. Hodgson

(57) ABSTRACT

In accordance with one embodiment, a failure prognostic package includes a substrate having a first surface and an opposite second surface. An electronic component trace is coupled to the first surface. An electronic component is electrically coupled to the electronic component trace. A prognostic trace is coupled to the first surface of the substrate and is electrically isolated from the electronic component. A failure zone of the failure prognostic package includes a plurality of sides and a plurality of corners, wherein the prognostic trace is weaker at the failure zone than the electronic component trace. Failure of the prognostic trace does not cause failure of the failure prognostic package. However, failure of the prognostic trace provides advanced notice of failure of the failure prognostic package.

18 Claims, 5 Drawing Sheets ated States Patent

PACKAGE FAILURE PROGNOSTIC STRUCTURE AND METHOD

BACKGROUND OF THE INVENTION

1. Field of the Invention

The present application relates to the field of electronics, and more particularly, to methods of forming electronic component packages and related structures.

2. Description of the Related Art

Abrupt unavailability of an electronic device such as a cell phone or laptop computer is often catastrophic for the user, resulting in lost data or, at a minimum, inconvenience to the user. Generally, it is preferable to have advanced notice of the unavailability of the electronic device so that the user can take appropriate measures to minimize the disruption.

For example, cell phones and laptop computers typically provide a notification, e.g., an audible beep, that the battery is about to go dead thus allowing the user to take appropriate measures before the cell phone or laptop computer becomes unavailable. For example, the user may back up important data on a laptop computer or finish the conversation on a cell phone.

However, in the case of hardware failure of an electronic device, there is typically no advanced notice of the failure, which is undesirable.

SUMMARY OF THE INVENTION

In accordance with one embodiment, a failure prognostic package includes a substrate having a first surface and an opposite second surface. An electronic component trace is coupled to the first surface. An electronic component is electrically coupled to the electronic component trace. A prognostic trace is coupled to the first surface of the substrate and is electrically isolated from the electronic component. A failure zone of the failure prognostic package includes a plurality of sides and a plurality of corners, wherein the prognostic trace is weaker at the failure zone than the electronic component trace.

Failure of the prognostic trace does not cause failure of the failure prognostic package. However, failure of the prognostic trace provides advanced notice of failure of the failure prognostic package. By providing this advanced notice, e.g., as a visual or audible indication, to a user of the electronic device, e.g., a cell phone or laptop computer, using the failure prognostic package, the user is provided advanced notice of the unavailability of the electronic device. This allows the user to take appropriate measures to minimize the disruption. Illustratively, the user can backup important data and take the electronic device for preemptive servicing and repair prior to failure of the electronic device.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
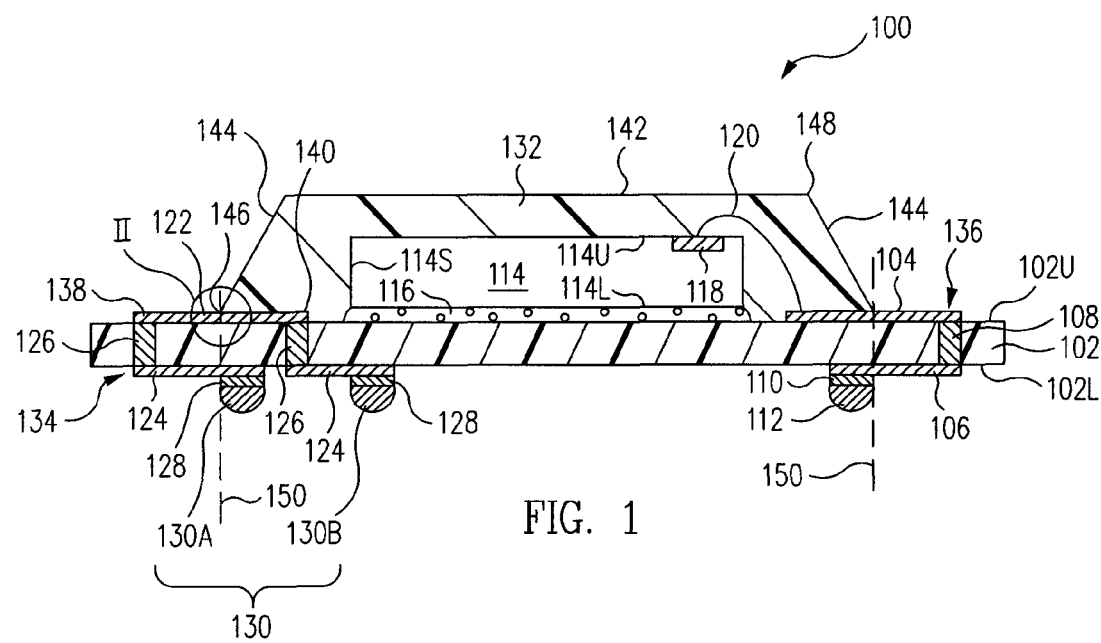
FIG. 1 is a cross-sectional view of a failure prognostic package in accordance with one embodiment of the present invention.

FIG. 1 is a cross-sectional view of a failure prognostic package 100 in accordance with one embodiment of the present invention. Failure prognostic package 100 includes a substrate 102, e.g., formed of metal, with ceramic, pre-molded plastic or laminate materials, although substrate 102 may be formed of other materials in other embodiments. Substrate 102 includes an upper, e.g., first, surface 102U and a lower, e.g., second, surface 102L, opposite upper surface 102U.

Formed on upper surface 102U of substrate 102 are a plurality of electrically conductive upper, e.g., first, electronic component traces 104. Formed on lower surface 102L of substrate 102 are a plurality of electrically conductive lower, e.g., second, electronic component traces 106. Extending through substrate 102 from lower surface 102L to upper surface 102U are a plurality of electrically conductive electronic component vias 108. Lower electronic component traces 106 are electrically connected to upper electronic component traces 104 by the electronic component vias 108.

Formed on lower electronic component traces 106 are electrically conductive electronic component pads 110. Formed on electronic component pads 110 are electrically conductive electronic component interconnection balls 112, e.g., solder.

Mounted, sometimes called die attached, to upper surface 102U of substrate 102 is an electronic component 114. More particularly, a lower, e.g., first, surface 114L of electronic component 114 is mounted to upper surface 102U, for example, with an adhesive 116, sometimes called a die attach adhesive.

Electronic component 114 further includes an upper, e.g., second, surface 114U. Bond pads 118 of electronic component 114 are formed on upper surface 114U of electronic component 114. In this embodiment, upper surface 102U, lower surface 114L, and upper surface 114U are parallel to one another. Although various structures may be described as being parallel or perpendicular, it is understood that the structures may not be exactly parallel or perpendicular but only substantially parallel or perpendicular to within accepted manufacturing tolerances.

In accordance with this embodiment, electronic component 114 is a semiconductor die, sometimes called an integrated circuit chip or an active component. However, in other embodiments, electronic component 114 is another type of electronic component such as a passive component, e.g., a resistor, capacitor or inductor.

Upper electronic component traces 104 are electrically connected to bond pads 118 by bond wires 120. Accordingly, electronic component 114 is sometimes said to be mounted in a wirebond configuration. However, in another embodiment, electronic component 114 is mounted in a flip chip configuration with solder bumps or other flip chip connectors physically and electrically connecting bond pads 118 to upper electronic component traces 104. Generally, bond pads 118 of electronic component 114 are electrically connected to upper electronic component traces 104.

Further, formed on upper surface 102U of substrate 102 is at least one electrically conductive upper, e.g., first, prognostic trace 122. Although a single upper prognostic trace 122 is discussed herein, in light of this disclosure, those of skill in the art will understand that failure prognostic package 100 is formed with a plurality of upper prognostic traces 122 in other embodiments.

Formed on lower surface 102L of substrate 102 is at least one, e.g., two or more, electrically conductive lower, e.g., second, prognostic traces 124. Extending through substrate 102 from lower surface 102L to upper surface 102U are a plurality, e.g., two or more, of electrically conductive prognostic vias 126. Lower prognostic traces 124 are electrically connected to upper prognostic traces 122 by prognostic vias 126.

Formed on lower prognostic traces 124 are electrically conductive prognostic pads 128. Formed on prognostic pads 128 are electrically conductive prognostic interconnection balls 130, e.g., solder.

Electronic component interconnection balls 112 and prognostic interconnection balls 130 are used to connect failure prognostic package 100 to a larger substrate such as a printed circuit motherboard or another electronic component package or structure.

Although particular electrically conductive pathways between upper electronic component traces 104 and electronic component interconnection balls 112 and between upper prognostic trace 122 and prognostic interconnection balls 130 are described above, other electrically conductive pathways can be formed. For example, contact metallizations can be formed between the various electrical conductors. Alternatively, pads 110, 128 are not formed and interconnection balls 112, 130 are formed directly on lower traces 106, 124, respectively.

Further, instead of straight though vias 108, 126, in one embodiment, substrate 102 is a multilayer laminate substrate and a plurality of vias and/or internal traces form the electrical interconnection between traces 104, 122 and traces 106, 124, respectively.

In yet another embodiment, interconnection balls 112, 130 are distributed in an array format to form a ball grid array (BGA) type package. Alternatively, interconnection balls 112, 130 are not formed, e.g., to form a metal land grid array (LGA) type package. In yet another alternative, pads 110, 128 and interconnection balls 112, 130 are not formed, e.g., to form a leadless chip carrier (LCC) type package. BGA, LGA and LCC type packages are well known to those of skill in the art. Other electrically conductive pathway modifications will be obvious to those of skill in the art in light of this disclosure.

Upper and lower surfaces 102U, 102L of substrate 102 may include an outermost insulative cover coat, e.g., an epoxy based resin, through which electrically conductive bond fingers, e.g., the end portions, of upper electronic component traces 104 and pads 110, 128 are exposed.

Failure prognostic package 100 further includes a dielectric package body 132, e.g., a plastic encapsulant or molding compound. Package body 132 encloses and protects electronic component 114, bond wires 120, and a portion of upper surface 102U of substrate 102. Further, package body 132 encloses a portion of upper electronic component traces 104 and a portion of upper prognostic trace 122.

Upper prognostic trace 122, lower prognostic traces 124, prognostic vias 126, prognostic pads 128, and prognostic interconnection balls 130 form a failure prognostic structure 134. Failure prognostic structure 134 prognosticates, e.g., foretells or provides advanced notice of, failure of failure prognostic package 100. More particularly, upper prognostic trace 122 is more prone to failure than upper electronic component traces 104.

Failure prognostic structure 134 including upper prognostic trace 122 is electrically isolated from electronic component 114, e.g., bond pads 118. Stated another way, failure prognostic structure 134 is unrelated to the operation of electronic component 114 including propagation of signals to/from electronic component 114.

In accordance with this embodiment, failure prognostic structure 134 is electrically isolated from bond wires 120, upper electronic component traces 104, electronic component vias 108, lower electronic component traces 106, electronic component pads 110, and electronic component interconnection balls 112, which form an electronic component signal propagation structure 136. Electronic component signal propagation structure 136 is used to propagate signals to/from electronic component 114 and thus is related to the operation of electronic component 114.

To detect failure of upper prognostic trace 122, the resistance of upper prognostic trace 122 is continuously or periodically measured. More particularly, upper prognostic trace 122 includes a first end 138 and a second end 140. The resistance between first end 138 and a second end 140 is measured to detect failure of upper prognostic trace 122.

In accordance with this embodiment, the resistance between a first prognostic interconnection ball 130A of the plurality of prognostic interconnection balls 130 and a second prognostic interconnection ball 130B of the plurality of prognostic interconnection balls 130 is measured to effectively measure the resistance between first end 138 and second end 140 of upper prognostic trace 122.

More particular, first prognostic interconnection ball 130A is electrically connected to first end 138 of upper prognostic trace 122 by the respective prognostic pad 128, lower prognostic trace 124 and prognostic via 126. Similarly, second prognostic interconnection ball 130B is electrically connected to second end 140 of upper prognostic trace 122 by the respective prognostic pad 128, lower prognostic trace 124 and prognostic via 126.

Figure 2:
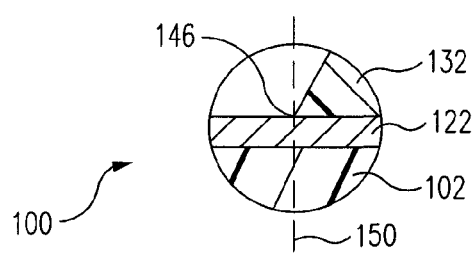
FIG. 2 is an enlarged cross-sectional view of the region II of the failure prognostic package of FIG. 1 illustrating an upper prognostic trace in the normal state in accordance with one embodiment.

FIG. 2 is an enlarged cross-sectional view of the region II of failure prognostic package 100 of FIG. 1 illustrating upper prognostic trace 122 in the normal state in accordance with one embodiment. Referring now to FIGS. 1 and 2 together, package body 132 includes a principal surface 142 and a plurality, e.g., four, of sidewalls 144. Sidewalls 144 extend between upper surface 102U of substrate 102 and principal surface 142.

Package body 132 includes a lower peripheral edge 146 where sidewalls 144 intersects, i.e., contact, upper surface 102U of substrate 102. Stated another way, lower peripheral edge 146, sometimes called a mold edge, is defined by the outermost, i.e., peripheral, points of contact of package body 132 with upper surface 102U of substrate 102.

Package body 132 further includes an upper peripheral edge 148, which defines principal surface 142, i.e., the periphery thereof. Sidewalls 144 extend vertically upwards from lower peripheral edge 146 to upper peripheral edge 148.

Due to the transition from being uncovered with package body 132 outward of lower peripheral edge 146 to being covered inward of lower peripheral edge 146 of package body 132, failure prognostic package 100 including upper prognostic trace 122 and upper electronic component traces 104 has the greatest physical stresses applied at lower peripheral edge 146 of package body 132. Accordingly, the portion of failure prognostic package 100 directly below lower peripheral edge 146 of package body 132 is called the failure zone 150 of failure prognostic package 100. Stated another way, lower peripheral edge 146 defines failure zone 150 of failure prognostic package 100.

More particularly, due to thermal expansion and mechanical force applied to failure prognostic package 100, maximum bending and/or expansion/contraction of failure prognostic package 100 occurs at failure zone 150. Depending upon the severity of this bending and/or expansion/contraction, upper prognostic trace 122 and upper electronic component traces 104 typically fail at failure zone 150, which is directly aligned with and below lower peripheral edge 146 of package body 132.

FIG. 2 illustrates upper prognostic trace 122 in a normal state, sometimes called an intact state or pre-failure state. In the normal state, upper prognostic trace 122 is a continuous electrical conductor, sometimes called a closed circuit. Accordingly, a resistance measurement of the resistance between first end 138 and second end 140 of upper prognostic trace 122, i.e., by measuring the resistance between prognostic interconnection balls 130A, 130B, when upper prognostic trace 122 is in the normal state is approximately zero indicating a continuous electrical conductor.

Figure 3:
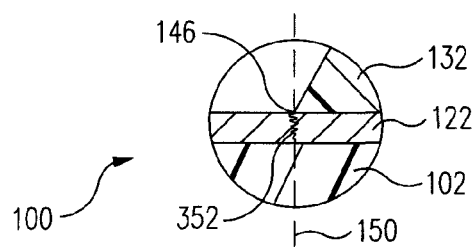
FIG. 3 is an enlarged cross-sectional view of the region II of the failure prognostic package of FIG. 1 illustrating the upper prognostic trace in the failed state in accordance with one embodiment.

FIG. 3 is an enlarged cross-sectional view of the region II of failure prognostic package 100 of FIG. 1 illustrating upper prognostic trace 122 in the failed state in accordance with one embodiment. Referring now to FIG. 3, upper prognostic trace 122 includes a defect 352, e.g., a complete crack or break. In the failed state, upper prognostic trace 122 is a discontinuous electrical conductor, sometimes called an open circuit. Accordingly, a resistance measurement of the resistance between first end 138 and second end 140 of upper prognostic trace 122, i.e., by measuring the resistance between prognostic interconnection balls 130A, 130B, when upper prognostic trace 122 is in the failed state is approximately infinity indicating a discontinuous electrical conductor. By measuring this change in resistance of upper prognostic trace 122 from the normal state to the failed state, defect 352 is readily detected.

As described above, defect 352 is a complete crack or break thus electrically isolating first end 138 from second end 140 of upper prognostic trace 122. In accordance with another embodiment, defect 352 is a partial crack or break thus increasing the resistance between, but not completely electrically disconnecting, first end 138 and second end 140 of upper prognostic trace 122. Accordingly, defect 352 effectively forms a resistor between first end 138 and second end 140 of upper prognostic trace 122 in this embodiment.

In accordance with this embodiment, the resistance measurement of the resistance between first end 138 and second end 140 of upper prognostic trace 122 in the failed state is substantially greater than the resistance measurement of the resistance between first end 138 and second end 140 of upper prognostic trace 122 in the normal state. By measuring this change in resistance of upper prognostic trace 122 from the normal state to the failed state, defect 352 is readily detected.

As discussed below in greater detail with reference to FIGS. 4, 5, 6, and 7, upper prognostic trace 122 is more prone to failure compared to upper electronic component trace 104. Stated another way, upper prognostic trace 122 is weaker at failure zone 150 than upper electronic component trace 104 thus causing upper prognostic trace 122 to fail before upper electronic component trace 104.

As discussed above, upper prognostic trace 122 is unrelated to the operation of electronic component 114. Accordingly, failure of upper prognostic trace 122 does not affect the operation of electronic component 114. More generally, failure of upper prognostic trace 122 does not cause failure of failure prognostic package 100.

However, failure of upper prognostic trace 122 is an advanced notice of impending failure of upper electronic component trace 104. Accordingly, failure of upper prognostic trace 122 provides advanced notice of failure of failure prognostic package 100.

By providing this advanced notice, e.g., as a visual or audible indication, to a user of the electronic device, e.g., a cell phone or laptop computer, using failure prognostic package 100, the user is provided advanced notice of the unavailability of the electronic device. This allows the user to take appropriate measures to minimize the disruption. Illustratively, the user can backup important data and take the electronic device for preemptive servicing and repair prior to failure of the electronic device.

Figure 4:
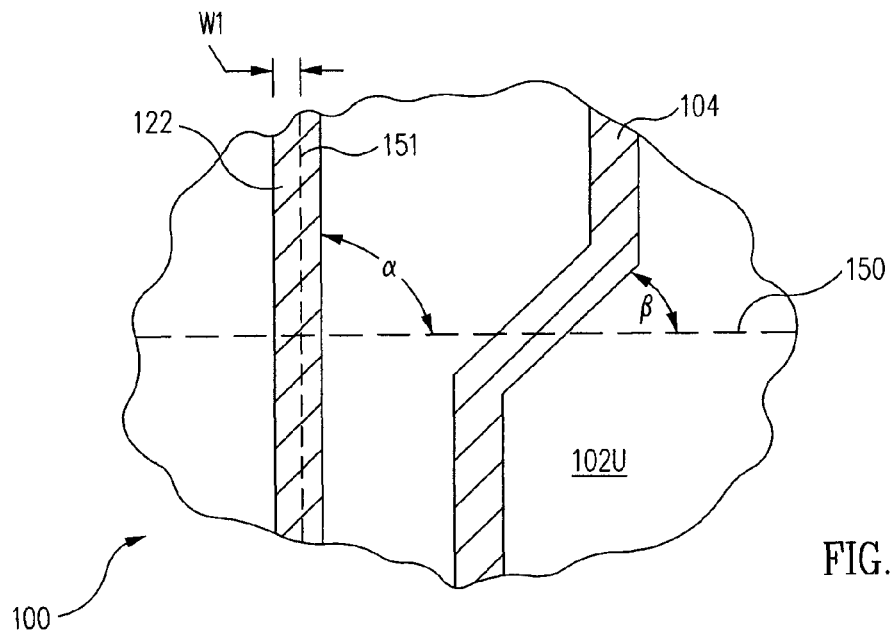
FIG. 4 is a top plan view of a portion of the failure prognostic package of FIG. 1 illustrating an upper electronic component trace and the upper prognostic trace in accordance with one embodiment.

FIG. 4 is a top plan view of a portion of failure prognostic package 100 of FIG. 1 illustrating an upper electronic component trace 104 and upper prognostic trace 122 in accordance with one embodiment. Referring now to FIG. 4, only failure zone 150 (directly aligned with lower peripheral edge 146 of package body 132) is illustrated to allow visualization of upper electronic component trace 104 and upper prognostic trace 122.

Referring now to FIGS. 1 and 4 together, failure zone 150, i.e., the side thereof in the view of FIG. 4, is a straight line. Upper prognostic trace 122 is perpendicular to failure zone 150 at the intersection of upper prognostic trace 122 and failure zone 150. Stated another way, an angle $\alpha$ between upper prognostic trace 122, i.e., the length thereof, and failure zone 150 is approximately equal to 90°.

In contrast, upper electronic component trace 104 is non-perpendicular, sometimes called angled, to failure zone 150 at the intersection of upper electronic component trace 104 and failure zone 150. Stated another way, an angle $\beta$ between upper electronic component trace 104, i.e., the length thereof, and failure zone 150 is less than 90°.

Forming upper prognostic trace 122 perpendicular to failure zone 150 and upper electronic component trace 104 angled to failure zone 150 causes upper prognostic trace 122 to fail prior to, sometimes called preferentially to, upper electronic component trace 104.

More particularly, as failure prognostic package 100 flexes and/or expands/contracts back and forth at failure zone 150, upper prognostic trace 122 and upper electronic component trace 104 are stretched and compressed. Since upper prognostic trace 122 is perpendicular to failure zone 150, this stretching and compressing occurs directly parallel to the length of upper prognostic trace 122 thus maximizing the stretching and compressing of upper prognostic trace 122 at failure zone 150.

Conversely, since upper electronic component trace 104 is angled to failure zone 150, this stretching and compressing is offset with respect to the length of upper electronic component trace 104. Accordingly, some of the stretching and compressing straightens and bends upper electronic component trace 104 thus reducing the stretching and compressing of upper electronic component trace 104 at failure zone 150.

Stated another way, forming upper electronic component trace 104 angled with respect to failure zone 150 provides slack in upper electronic component trace 104 that absorbs some of the stretching and compressing. Accordingly, upper prognostic trace 122 is more prone to failure as compared to upper electronic component trace 104. In another embodiment, instead of providing a single electronic component trace 104, two or more redundant electronic component traces 104 are connected together to reduce the likelihood of open circuit failure of electronic component traces 104.

In FIG. 4, the width of upper prognostic trace 122 is approximately equal to the width of upper electronic component trace 104 at failure zone 150. However, in an alternative embodiment such as that set forth below in reference to FIG. 5, the width of upper prognostic trace 122 is less than the width of upper electronic component trace 104.

Figure 5:
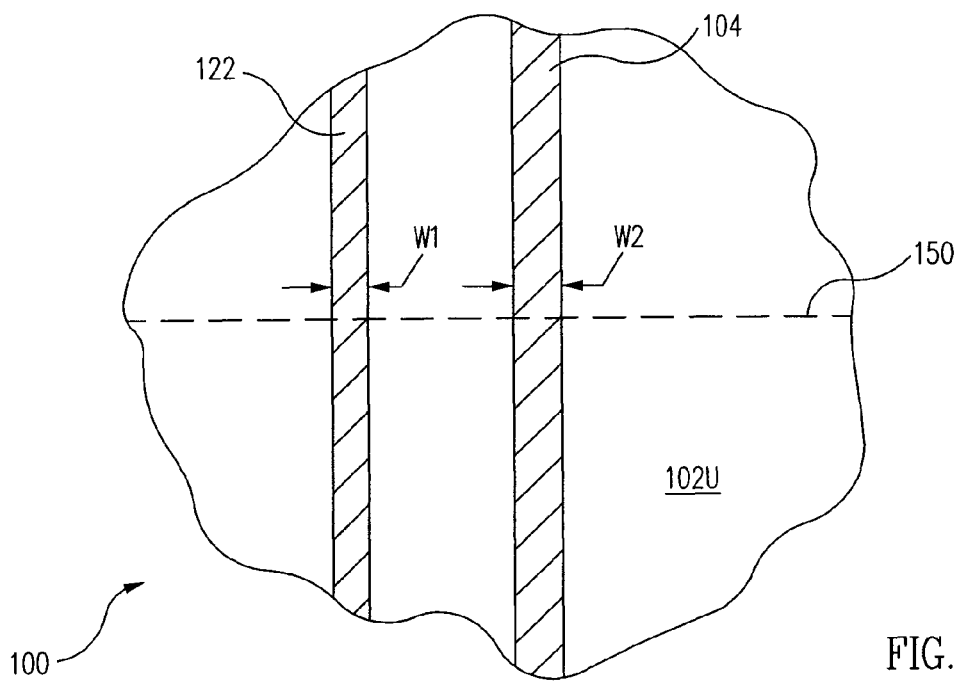
FIG. 5 is a top plan view of a portion of the failure prognostic package of FIG. 1 illustrating an upper electronic component trace and the upper prognostic trace in accordance with another embodiment.

FIG. 5 is a top plan view of a portion of failure prognostic package 100 of FIG. 1 illustrating an upper electronic component trace 104 and upper prognostic trace 122 in accordance with another embodiment. Referring now to FIG. 5, only failure zone 150 is illustrated to allow visualization of upper electronic component trace 104 and upper prognostic trace 122.

Referring now to FIGS. 1 and 5 together, failure zone 150 is a straight line. Both upper prognostic trace 122 and upper electronic component trace 104 are perpendicular to failure zone 150 at the intersection with failure zone 150. However, in accordance with this embodiment, upper prognostic trace 122 is thinner than upper electronic component trace 104 at the intersection with failure zone 150.

More particularly, upper prognostic trace 122 has a first width W1 at failure zone 150. Upper electronic component trace 104 has a second width W2 at failure zone 150. Width W2 of upper electronic component trace 104 is greater than width W1 of upper prognostic trace 122.

Forming upper prognostic trace 122 thinner than upper electronic component trace 104 causes upper prognostic trace 122 to fail prior to, sometimes called preferentially to, upper electronic component trace 104.

More particularly, as failure prognostic package 100 flexes and/or expands/contracts back and forth at failure zone 150, upper prognostic trace 122 and upper electronic component trace 104 are stretched and compressed approximately equal. However, since upper prognostic trace 122 is thinner than upper electronic component trace 104, upper prognostic trace 122 is weaker than upper electronic component trace 104. Accordingly, the essentially equal stretching and compressing of upper prognostic trace 122 and upper electronic component trace 104 causes the weaker upper prognostic trace 122 to fail prior to upper electronic component trace 104.

In accordance with yet another embodiment, upper prognostic trace 122 is formed perpendicular to failure zone 150 and upper electronic component trace is formed angled to failure zone 150. At the same time, upper prognostic trace 122 is thinner than upper electronic component trace 104. For example, as illustrated in FIG. 4, upper prognostic trace 122 is formed with width W1 as indicated by the dashed line 151.

Figure 6:
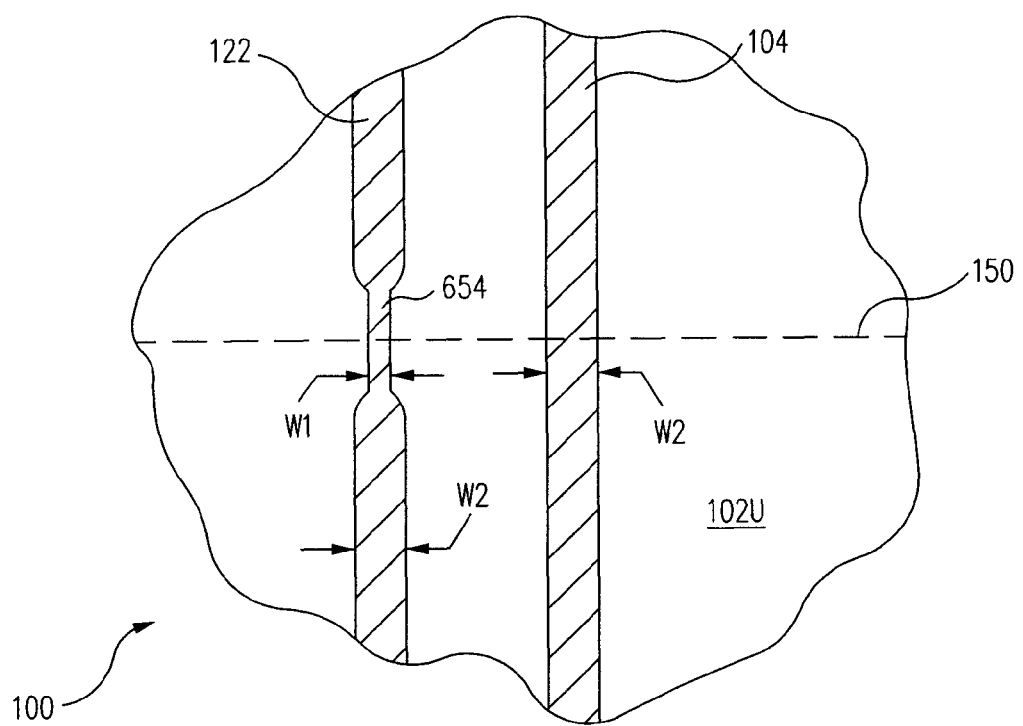
FIG. 6 is a top plan view of a portion of the failure prognostic package of FIG. 1 illustrating an upper electronic component trace and the upper prognostic trace in accordance with yet another embodiment.

FIG. 6 is a top plan view of a portion of failure prognostic package 100 of FIG. 1 illustrating an upper electronic component trace 104 and upper prognostic trace 122 in accordance with yet another embodiment. Referring now to FIG. 6, only failure zone 150 is illustrated to allow visualization of upper electronic component trace 104 and upper prognostic trace 122.

Referring now to FIGS. 1 and 6 together, failure zone 150 is a straight line. Both upper prognostic trace 122 and upper electronic component trace 104 are perpendicular to failure zone 150 at the intersection with failure zone 150. However, in accordance with this embodiment, upper prognostic trace 122 is thinner than upper electronic component trace 104 at the intersection with failure zone 150.

More particularly, upper prognostic trace 122 has a first width W1 at failure zone 150. Upper electronic component trace 104 has a second width W2 at failure zone 150. Width W2 of upper electronic component trace 104 is greater than width W1 of upper prognostic trace 122.

Forming upper prognostic trace 122 thinner than upper electronic component trace 104 at failure zone 150 causes upper prognostic trace 122 to fail prior to upper electronic component trace 104 as discussed above in reference to FIG. 5.

However, in accordance with this embodiment, upper prognostic trace 122 is formed with a thin portion 654 only at failure zone 150. Thin portion 654 has width W1. In contrast, the remaining portions, i.e., the portions other than thin portion 654, have a same width W2 as width W2 of upper electronic component trace 104.

Figure 7:
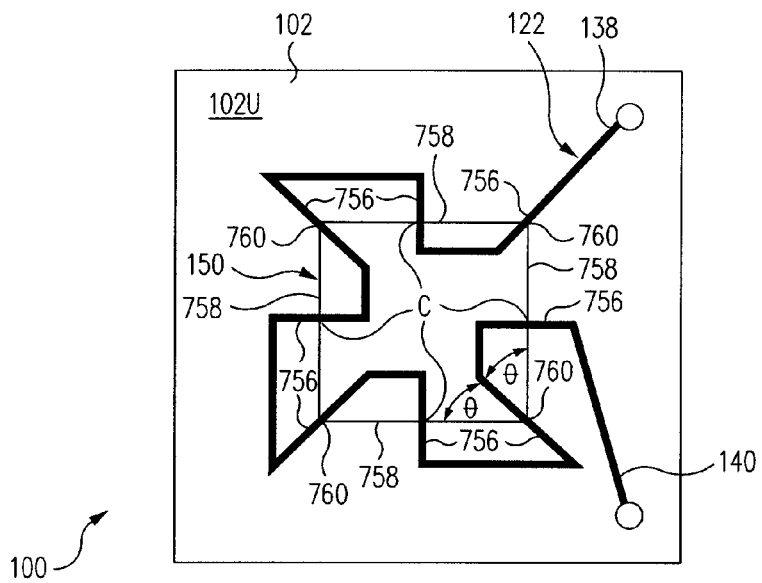
FIG. 7 is a top plan view of the failure prognostic package of FIG. 1 in accordance with one embodiment.

FIG. 7 is a top plan view of failure prognostic package 100 of FIG. 1 in accordance with one embodiment. For clarity a presentation, in FIG. 7, only upper surface 102U of substrate 102, upper prognostic trace 122, and failure zone 150 are illustrated although it is to be understood that failure prognostic package 100 includes the various features as discussed above with reference to FIG. 1.

In accordance with this embodiment, upper prognostic trace 122 includes a plurality of prognostic bisecting traces 756 connected in series. Prognostic bisecting traces 756 are portions of upper prognostic trace 122.

In accordance with this embodiment, failure zone 150 is rectangular, e.g., square, when viewed from the top plan view as seen in FIG. 7. Failure zone 150 includes four straight sides 758 perpendicularly intersecting one another at corners 760.

In accordance with this embodiment, each side 758 perpendicularly intersects a respective prognostic bisecting trace 756. As illustrated in FIG. 7, prognostic bisecting traces 756 intersect sides 758 approximately at centers C of sides 758, i.e., prognostic bisecting traces 756 bisect sides 758. Centers C are equidistant from respective corners 760.

However, in other embodiments, prognostic bisecting traces 756 intersect sides 758 offset from centers C of sides 758. Further, although upper prognostic trace 122 including prognostic bisecting traces 756 are illustrated as intersecting all four sides 758, in another embodiment, only one, two or three of sides 758 intersect upper prognostic trace 122.

Further, prognostic bisecting traces 756 bisect corners 760. Specifically, each corners 760 is defined at the intersection of two of sides 758. Prognostic bisecting traces 756 intersect corners 760 and bisect the angle created by the respective sides 758 that define the respective corner 760. To illustrate, an angle θ exist between prognostic bisecting trace 756 and sides 758.

As illustrated in FIG. 7, prognostic bisecting traces 756 bisects corners 760. However, in other embodiments, prognostic bisecting traces 756 intersect, yet do not bisect, corners 760. Further, although upper prognostic trace 122 including prognostic bisecting traces 756 is illustrated as intersecting all four corners 760, in another embodiment, only one, two or three of corners 760 intersect upper prognostic trace 122.

In accordance with this embodiment, upper prognostic trace 122 is sometimes called a monitoring net. By forming upper prognostic trace 122 to intersect failure zone 150 at the weak points expected to have maximum bending and/or expansion/contraction, i.e., at centers C of sides 758 and corners 760, upper prognostic trace 122 has a predisposition to fail as compared to upper electronic component traces 104 (not illustrated in FIG. 7, see FIG. 1). Further, failure of any prognostic bisecting traces 756 creates an open circuit of upper prognostic trace 122 between ends 138, 140 of upper prognostic trace 122. This provides advance notice of failure of failure prognostic package 100 as discussed above.

In the above embodiments, failure zone 150, effectively lower peripheral edge 146 of package body 132, is set forth as the weak points of failure prognostic package 100, e.g., the points having maximum bending and/or expansion/contraction. However, in other embodiments, other failure zones of a failure prognostic package are created by the particular design of the failure prognostic package. Generally, at least one upper prognostic trace 122 intersects a failure zone of the failure prognostic package to provide advance notice of failure of the prognostic package. As discussed below in reference to FIG. 8, in one embodiment, the peripheral edge of the electronic component defines the failure zone of the failure prognostic package.

Figure 8:
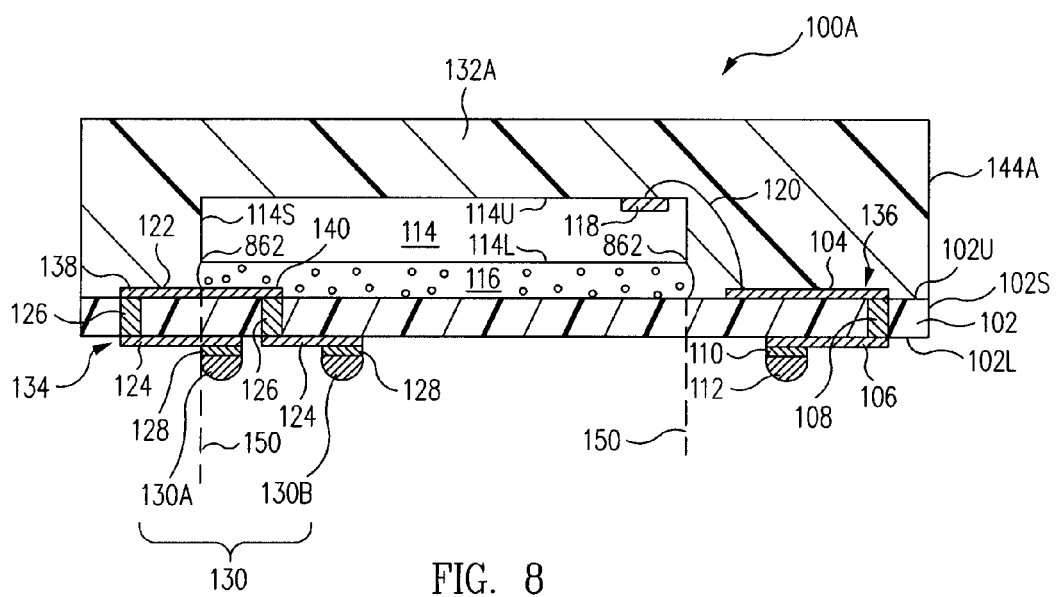
FIG. 8 is a cross-sectional view of a failure prognostic package in accordance with one embodiment of the present invention.

FIG. 8 is a cross-sectional view of a failure prognostic package 100A in accordance with one embodiment of the present invention. Failure prognostic package 100A of FIG. 8 is substantially similar to failure prognostic package 100 of FIG. 1 and only the significant differences between packages 100A, 100 are discussed below.

Referring now to FIG. 8, in accordance with this embodiment, a package body 132A entirely covers upper surface 102U of substrate 102 and has sidewalls 144A substantially aligned with and parallel to sides 102S of substrate 102. Thus, in accordance with this embodiment, package body 132A does not define the failure zone, i.e., the weak points, of failure prognostic package 100A.

Instead, electronic component 114 defines failure zone 150. More particularly, a peripheral edge 862 of lower surface 114L and generally sides 114S of electronic component 114 defines failure zone 150. Due to the transition from being uncovered by electronic component 114 outward of peripheral edge 862 to being covered inward of peripheral edge 862 by electronic component 114, upper prognostic trace 122 has the greatest physical stresses applied at peripheral edge 862 of electronic component 114.

Accordingly, the portion of failure prognostic package 100A directly below peripheral edge 862 and sides 114S of electronic component 114 is called failure zone 150 of failure prognostic package 100A. More particularly, due to thermal expansion and mechanical force applied to failure prognostic package 100A, maximum bending and/or expansion/contraction of failure prognostic package 100A occurs at failure zone 150 which defines the weak points of failure prognostic package 100A.

Figure 9:
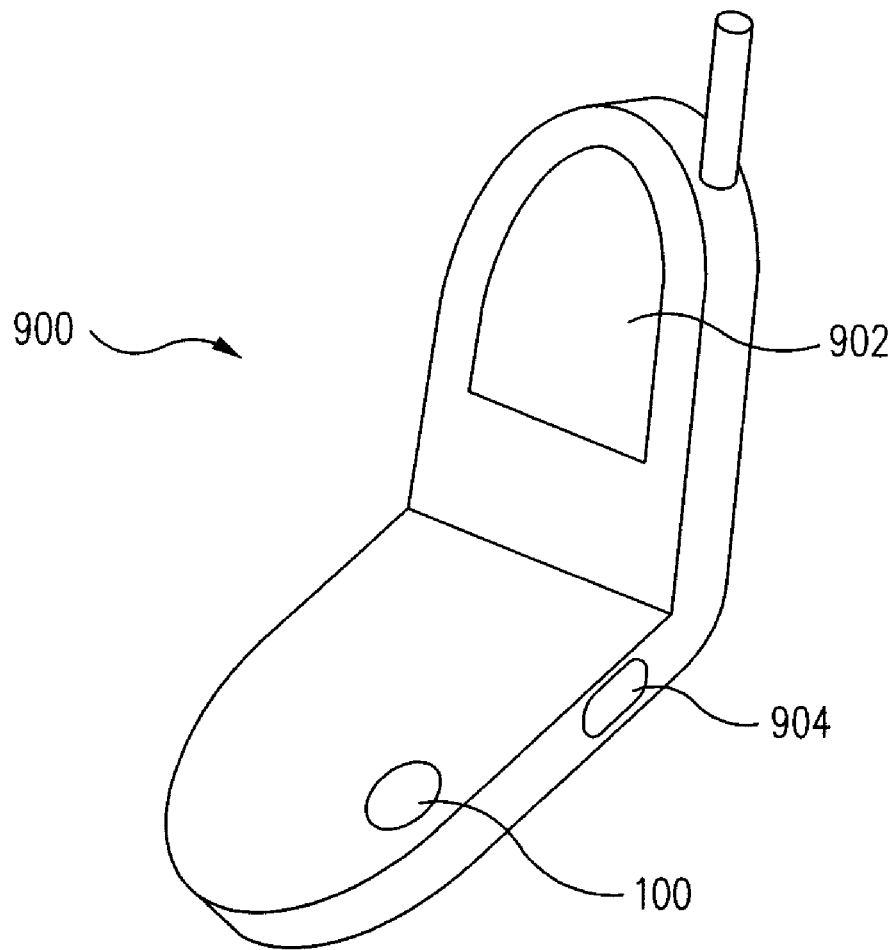
FIG. 9 is a perspective view of an electronic device incorporating the failure prognostic package of FIG. 1 in accordance with one embodiment.

FIG. 9 is a perspective view of an electronic device 900 incorporating failure prognostic package 100 of FIG. 1 in accordance with one embodiment. Illustratively, electronic device 900 is a portable computer, a workstation, a two-way pager, a cellular telephone, a digital wireless telephone, a personal digital assistant, a server computer, an Internet appliance, or any other device that includes failure prognostic package 100.

As discussed above, referring now to FIGS. 1 and 9 together, failure of upper prognostic trace 122 provides advanced notice of failure of failure prognostic package 100. In one embodiment, this advanced notice is provided as a visual indication on a display 902 of electronic device 900. In another embodiment, this advanced notice is provided as an audible indication from a speaker 904 of electronic device 900. By providing this advanced notice to a user of electronic device 900, the user is provided advanced notice of the unavailability of electronic device 900.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A failure prognostic package comprising:
   a substrate comprising a first surface and a second surface opposite the first surface;
   an electronic component trace coupled to the first surface;
   a prognostic trace coupled to the first surface, wherein the prognostic trace is more prone to failure as compared to the electronic component trace; and
   an electronic component electrically coupled to the electronic component trace, wherein the electronic component is electrically isolated from the prognostic trace.

2. The failure prognostic package of claim 1 wherein the electronic component comprises:
   a first surface coupled to the first surface of the substrate;
   a second surface; and
   a bond pad on the second surface, the failure prognostic package further comprising:
   a bond wire electrically coupling the bond pad to the electronic component trace.

3. A failure prognostic package comprising:
   a substrate comprising a first surface and a second surface opposite the first surface;
   an electronic component trace coupled to the first surface;
   a prognostic trace coupled to the surface, wherein the prognostic trace is more prone to failure as compared to the electronic component trace;
   an electronic component electrically coupled to the electronic component trace; and
   a package body enclosing the electronic component and a portion of the first surface of the substrate, the package body comprising a lower peripheral edge defining a failure zone of the failure prognostic package.

4. The failure prognostic package of claim 3 wherein the failure zone comprises a straight side, the prognostic trace being perpendicular to the failure zone at the failure zone, the electronic component trace being angled with respect to the failure zone at the failure zone.

5. The failure prognostic package of claim 4 wherein the prognostic trace has a first width at the failure zone, the electronic component trace having a second width at the failure zone greater than the first width.

6. The failure prognostic package of claim 3 wherein the failure zone comprises a straight side, wherein the prognostic trace has a first width at the failure zone, the electronic component trace having a second width at the failure zone greater than the first width.

7. The failure prognostic package of claim 6 wherein the prognostic trace comprises a thin portion having the first width at the failure zone, wherein remaining portions of the prognostic trace other than the thin portion have the second width.

8. A failure prognostic package comprising:
a substrate comprising a first surface and a second surface opposite the first surface;
an electronic component trace coupled to the first surface;
a prognostic trace coupled to the first surface, wherein the prognostic trace is more prone to failure as compared to the electronic component trace;
an electronic component electrically coupled to the electronic component trace; and
an adhesive coupling a first surface of the electronic component to the first surface of the substrate, a peripheral edge of the first surface of the electronic component defining a failure zone of the failure prognostic package.

9. The failure prognostic package of claim 8 wherein the failure zone comprises a straight side, the prognostic trace being perpendicular to the failure zone at the failure zone, the electronic component trace being angled with respect to the failure zone at the failure zone.

10. The failure prognostic package of claim 9 wherein the prognostic trace has a first width at the failure zone, the electronic component trace having a second width at the failure zone greater than the first width.

11. The failure prognostic package of claim 8 wherein the failure zone comprises a straight side, wherein the prognostic trace has a first width at the failure zone, the electronic component trace having a second width at the failure zone greater than the first width.

12. The failure prognostic package of claim 11 wherein the prognostic trace comprises a thin portion having the first width at the failure zone, wherein remaining portions of the prognostic trace other than the thin portion have the second width.

13. A failure prognostic package comprising:
a substrate comprising a first surface and an opposite second surface;
an electronic component trace coupled to a failure zone on the first surface;
an electronic component electrically coupled to the electronic component trace; and
a prognostic trace coupled to the failure zone on the first surface and electrically isolated from the electronic component, wherein the prognostic trace is weaker at the failure zone than the electronic component trace.

14. The failure prognostic package of claim 13 wherein the failure zone comprises a plurality of sides, the prognostic trace comprising a prognostic bisecting trace perpendicularly intersecting one of the sides.

15. The failure prognostic package of claim 13 wherein the failure zone comprises a plurality of corners, the prognostic trace comprising a prognostic bisecting trace intersecting one of the corners.

16. The failure prognostic package of claim 13 wherein the failure zone comprises a plurality of sides and a plurality of corners, the prognostic trace comprising a plurality of prognostic bisecting traces connected is series, the prognostic bisecting traces intersecting the sides and the corners.

17. A failure prognostic package comprising:
a substrate comprising a first surface;
a first electronic component trace coupled to the first surface;
a first prognostic trace coupled to the first surface, wherein the first prognostic trace is more prone to failure compared to the first electronic component trace;
second prognostic traces coupled to a second surface of the substrate;
prognostic vias electrically coupling the first prognostic trace to the second prognostic traces; and
prognostic interconnection balls electrically coupled to the second prognostic traces, wherein a resistance between a first prognostic interconnection ball of the prognostic interconnection balls and a second prognostic interconnection ball of the prognostic interconnection balls indicates a state of the first prognostic trace.

18. The failure prognostic package of claim 17 wherein the state is either a normal state or a failed state.

\* \* \* \* \*

UNITED STATES PATENT AND TRADEMARK OFFICE
CERTIFICATE OF CORRECTION

| | |
|---|---|
| PATENT NO. | : 8,022,521 B1 |
| APPLICATION NO. | : 12/269357 |
| DATED | : September 20, 2011 |
| INVENTOR(S) | : Akito Yoshida and Mahmoud Dreiza |

It is certified that error appears in the above-identified patent and that said Letters Patent is hereby corrected as shown below:

In Column 10, Line 45, Claim 3, between "coupled to the" and "surface", insert --first--;
In Column 12, Line 20, Claim 16, replace "connected is series" with --connected in series--;
In Column 12, Line 27, Claim 17, between "failure" and "compared", insert --as--.

Signed and Sealed this
Seventeenth Day of July, 2012

David J. Kappos
*Director of the United States Patent and Trademark Office*